United States Patent
Dutu et al.

(10) Patent No.: US 12,387,766 B2
(45) Date of Patent: Aug. 12, 2025

(54) PROVIDING DATA FROM PORTIONS OF A MEMORY TO PROCESSORS IN MEMORY (PIMs) IN AN ELECTRONIC DEVICE

(71) Applicant: Advanced Micro Devices, Inc., Santa Clara, CA (US)

(72) Inventors: Alexandru Dutu, Bellevue, WA (US); Vaibhav Ramakrishnan Ramachandran, Cupertino, CA (US); Michael W. Boyer, Redmond, WA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 470 days.

(21) Appl. No.: 17/512,662

(22) Filed: Oct. 27, 2021

(65) Prior Publication Data

US 2023/0130969 A1    Apr. 27, 2023

(51) Int. Cl.
*G11C 7/08* (2006.01)
*G11C 11/54* (2006.01)

(52) U.S. Cl.
CPC .............. *G11C 7/08* (2013.01); *G11C 11/54* (2013.01)

(58) Field of Classification Search
CPC .... G11C 7/00; G11C 7/08; G11C 7/10; G11C 7/1075; G11C 7/1006; G11C 7/4096; G11C 8/12; G11C 8/14; G11C 8/16; G11C 5/025; G06F 15/7821; G06F 15/00; G05B 2219/00; G05B 2219/13107

See application file for complete search history.

(56) References Cited

U.S. PATENT DOCUMENTS

| | | | |
|---|---|---|---|
| 9,535,876 B2 * | 1/2017 | Walker | G06F 9/30072 |
| 10,416,927 B2 * | 9/2019 | Lea | G06F 3/0611 |
| 10,795,815 B2 * | 10/2020 | Beard | G06F 15/7821 |
| 2021/0208894 A1 * | 7/2021 | Song | G06F 17/16 |
| 2021/0223996 A1 * | 7/2021 | Song | G11C 5/025 |
| 2022/0019441 A1 * | 1/2022 | Rosing | G16B 30/10 |

* cited by examiner

*Primary Examiner* — Alfredo Bermudez Lozada
(74) *Attorney, Agent, or Firm* — Kowert, Hood, Munyon, Rankin & Goetzel, P.C.; Rory D. Rankin

(57) ABSTRACT

A memory includes at least two portions of memory circuitry, a first processor in memory (PIM) functional block, and a second PIM functional block, each PIM functional block being associated with a respective different portion of the memory circuitry. In operation, the first PIM functional block copies data from a source location in a first portion of memory accessible to the first PIM functional block. The first PIM functional block then provides the data to the second PIM functional block. The second PIM functional block acquires and stores the data in a destination location in a second portion of memory accessible to the second PIM functional block. The second PIM functional block next performs one or more PIM operations using the data.

22 Claims, 7 Drawing Sheets

PROVIDING DATA FROM PORTIONS OF A MEMORY TO PROCESSORS IN MEMORY (PIMs) IN AN ELECTRONIC DEVICE

BACKGROUND

Related Art

Some electronic devices include processors (e.g., central processing units, etc.) that use data (e.g., program code instructions, inputs for or results of computational or control operations, etc.) for processor operations such as executing program code. Many of these electronic devices also include a memory (e.g., a main memory) in which copies of data are stored for use by the processors for processor operations. Because accessing data in memory is relatively slow compared to the speed of operation of a processor, the memory can serve as a bottleneck for processor operations. Designers have therefore proposed various techniques for reducing and/or avoiding the need for accessing data in the memory. One such technique involves including processor in memory (PIM) circuitry in memories. For example, some PIMs include an arithmetic logic unit (ALU) that performs mathematical, bitwise/logical, and other operations. With a PIM, data is loaded from the memory to the PIM (or from another source to the PIM) and the PIM performs desired operations on the data. After performing the operations on the data, the PIM can reload the data to the memory. Using a PIM therefore avoids the need for sending data from the memory to the processor to have operations performed on the data, which conserves both memory system bandwidth and processor operational bandwidth.

In some electronic devices, a memory includes a number of portions—i.e., logical or physical divisions of memory circuitry on one or more semiconductor memory chips/dies. For example, the portions can be or include banks, channels, etc. In some of these electronic devices, each portion has its own PIM. For example, when the portions are banks, each bank can include a separate per-bank PIM. Using a separate PIM for each portion enables performing PIM operations efficiently for data in the associated memory circuitry—and avoids the complexity, time, and electrical power consumption associated with transferring data between portions for performing PIM operations. In some of these memories, the per-portion PIMs are limited to accessing data in the respective portion for performing PIM operations and may not be permitted to access data in other portions. These PIMs are therefore only useful for performing PIM operations on a relatively small subset of data in the memory (i.e., data in relatively closely-grouped memory addresses in the respective portion of the memory). For tasks that require irregular memory accesses, and particularly irregular memory accesses between portions of the memory, such PIMs can be of little use.

BRIEF DESCRIPTION OF THE FIGURES

Throughout the figures and the description, like reference numerals refer to the same figure elements.

DETAILED DESCRIPTION

Figure 1:
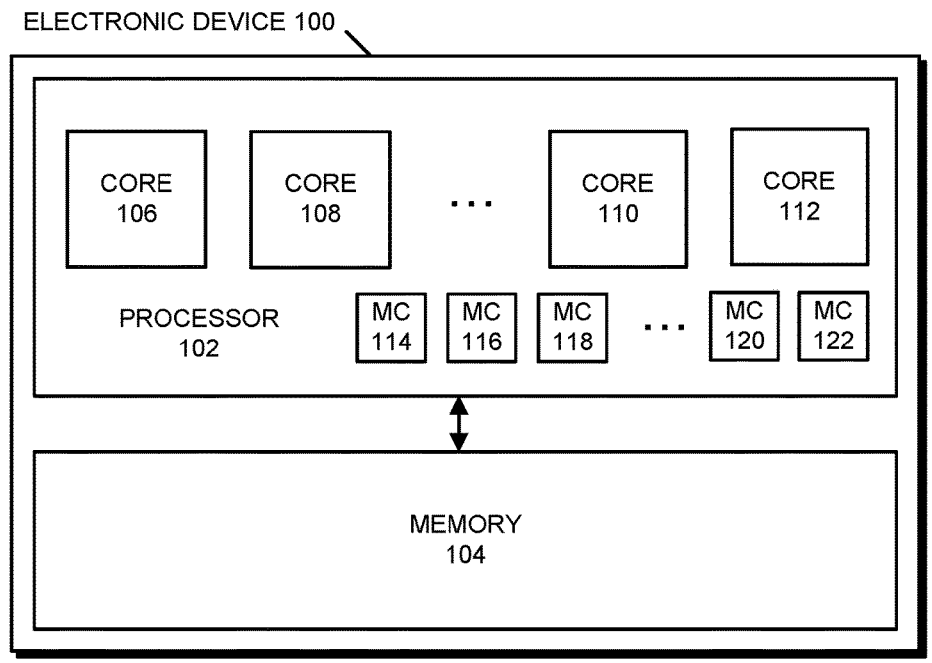
FIG. 1 presents a block diagram illustrating an electronic device in accordance with some embodiments.

The following description is presented to enable any person skilled in the art to make and use the described embodiments and is provided in the context of a particular application and its requirements. Various modifications to the described embodiments will be readily apparent to those skilled in the art, and the general principles described herein may be applied to other embodiments and applications. Thus, the described embodiments are not limited to the embodiments shown, but are to be accorded the widest scope consistent with the principles and features described herein.

Terminology

In the following description, various terms are used for describing embodiments. The following is a simplified and general description of some of the terms. Note that these terms may have significant additional aspects that are not recited herein for clarity and brevity and thus the description is not intended to limit these terms.

Functional block: functional block refers to a set of interrelated circuitry such as integrated circuit circuitry, discrete circuitry, etc. The circuitry is "interrelated" in that circuit elements in the circuitry share at least one property. For example, the circuitry may be included in, fabricated on, or otherwise coupled to a particular integrated circuit chip, substrate, circuit board, or portion thereof, may be involved in the performance of specified operations (e.g., computational operations, control operations, memory operations, etc.), may be controlled by a common control element and/or a common clock, etc. The circuitry in a functional block can have any number of circuit elements, from a single circuit element (e.g., a single integrated circuit logic gate or discrete circuit element) to millions or billions of circuit elements (e.g., an integrated circuit memory). In some embodiments, functional blocks perform operations "in hardware," using circuitry that performs the operations without executing program code.

Data: data is a generic term that indicates information that can be stored in memories and/or used in computational, control, and/or other operations. Data includes information such as actual data (e.g., results of computational or control operations, outputs of processing circuitry, inputs for computational or control operations, variable values, sensor values, etc.), files, program code instructions, control values, variables, and/or other information.

Memory accesses: memory accesses, or, more simply, accesses, include interactions that can be performed for, on, using, and/or with data stored in memory. For example, accesses can include writes or stores of data to memory, reads of data in memory, invalidations or deletions of data in memory, moves of data in memory, writes or stores to metadata associated with data in memory, etc. In some cases, copies of data are accessed in a cache and accessing the copies of the data can include interactions that can be performed for, on, using, and/or with the copies of the data stored in the cache (such as those described above), along with cache-specific interactions such as updating coherence or access permission information, etc.

Overview

In the described embodiments, an electronic device includes a processor that performs operations for which the processor uses data (e.g., computational, control, and/or other operations). The electronic device also includes a memory having memory circuitry that is used for storing copies of data for use by the processor. For example, in some embodiments, the memory includes a number of stacked semiconductor integrated circuit dies/chips with dynamic random access memory (DRAM) memory circuitry fabricated thereon. The memory circuitry in the memory is divided into a number of hierarchical levels with each level including some of the memory circuitry. For example, in some embodiments, the levels include channels and banks. Some or all of the levels are logically and/or physically divided into a number of parts, or "portions," with each portion including a separate subset of the memory circuitry of that level. For example, the portions may include banks of memory circuitry. In the described embodiments, the memory also includes processing circuitry, or "processor-in-memory" (PIM) functional blocks, that perform PIM operations on data in the memory. Separate PIM functional blocks are included in respective portions of the memory. For example, in some embodiments, the portions are banks and each portion/bank includes a separate/per-bank PIM functional block. The PIM functional blocks can acquire data from the respective portion of the memory (or from another source), perform PIM operations on the data, and write the resulting data to the memory, so that the operations are performed by the PIM instead of the processor. In this way, the data does not need to leave the portion of the memory (e.g., be sent to the processor) in order to have the operations to be performed on the data.

In the described embodiments, the PIM functional blocks in portions of the memory do not themselves directly access data stored in other portions of the memory. In other words, the PIM functional blocks do not directly read data from/ write data to the memory circuitry in other portions of the memory. Although PIM functional blocks may be capable of directly accessing data in other portions of the memory, such accesses are slow and inefficient and are therefore avoided. Instead, PIM functional blocks directly access only data in the respective portion of the memory (or in PIM functional block internal elements such as a register file, etc.). In some situations, however, PIM functional blocks may use data from other portions of the memory for performing PIM operations. For example, when performing PIM operations for software applications with irregular memory accesses such as graph applications, graphical applications (e.g., ray tracing, etc.), and/or machine learning applications, a PIM functional block may use data from other portions of the memory. The described embodiments therefore include mechanisms for copying data from other portions of a memory into a respective portion of the memory for a PIM functional block. In other words, the described embodiments copy data from other portions of the memory into the respective portions of the memory for PIM functional blocks so that PIM functional blocks can access the copied data in the respective portion of the memory. The mechanisms include a swizzle scratch pad accessible to all of the PIM functional blocks that serves as an intermediary for copying data between portions of the memory. The mechanisms also include a number of PIM instructions that, when executed by PIM functional blocks, cause the PIM functional blocks to perform PIM operations for accessing data in the swizzle scratch pad. The mechanisms further include portion-masking elements, e.g., bank-masking elements, that can be used for controlling whether (or not) PIM functional blocks in respective portions of the memory perform PIM operations.

In the described embodiments, the memory—i.e., functional blocks and elements in the memory—performs operations for providing copies of data from other portions of the memory to a particular PIM functional block in a respective portion of the memory. As part of these operations, when a particular PIM functional block is to perform PIM operations on data from other portions of the memory, at least one other PIM functional block (i.e., other than the particular PIM functional block) copies data from a source location accessible to the other PIM functional block and provides the data to the particular PIM functional block. For example, each of the other PIM functional blocks can copy data from their respective portion of the memory and provide the data to the particular PIM functional block. The particular PIM functional block acquires and stores the data in a destination location accessible to the particular PIM functional block. For example, the particular PIM may store the acquired data in its respective portion of the memory or in a PIM register file in the particular PIM. The particular PIM then performs one or more PIM operations using the data (e.g., ALU operations on or using the data, executing PIM instructions on or using the data, etc.).

In some embodiments, the PIM functional blocks use a swizzle scratch pad for copying the data between portions of the memory. In these embodiments, a PIM functional block can write data acquired from a source location for the PIM functional block (e.g., the respective portion of the memory, a PIM register file, etc.) into the swizzle scratch pad. A PIM functional block can then read the data from the swizzle scratch pad and store the data in a destination location for the PIM functional block (e.g., the respective portion of the memory, a PIM register file, etc.), from where the PIM functional block can perform PIM operations on or using the data. The swizzle scratch pad is a functional block that includes memory circuitry into which PIM functional blocks can write copies of data and from which PIM functional blocks can read/acquire copies of data. The swizzle scratch pad is in a location in the memory that is accessible to multiple, and typically all, PIM functional blocks. For example, in some embodiments, the memory includes multiple stacked DRAM dies with DRAM memory circuitry and a logic/base die with processing/logic and communication interface circuitry, and the swizzle scratch pad is located on the logic/base die.

In some embodiments, PIM functional blocks can execute instructions that cause the PIM functional blocks to perform corresponding PIM operations. In some of these embodiments, the instructions include instructions that cause PIM functional blocks to perform PIM operations for accessing data in the swizzle scratch pad. For example, in some embodiments, the instructions include the PIM_SwizzledWrite and PIM_SwizzledRead instructions. The PIM_SwizzledWrite and PIM_SwizzledRead instructions are instructions that cause executing PIM functional blocks to write and read data in the swizzle scratch pad, respectively. The PIM_SwizzledWrite and PIM_SwizzledRead are vector write and read instructions that cause an executing PIM functional block to write/read multiple locations, i.e., elements/lanes, of the swizzle scratch pad in parallel. The PIM_SwizzledWrite causes a PIM functional block to write a total of N bytes of data acquired from the respective portion of the memory (or another location accessible to the PIM functional block) into sequential or non-sequential locations in the swizzle scratch pad (N=256, 500, or another number). The PIM_SwizzledRead causes a PIM functional block to read a total of N bytes of data from sequential or non-sequential locations in the swizzle scratch pad and store the data into a respective portion of the memory (or another PIM functional block-accessible location). The PIM_SwizzledWrite and PIM_SwizzledRead instructions include an offset parameter that enables controlling an offset in the swizzle scratch pad to where data is written or from where data is read. The PIM_SwizzledWrite and PIM_SwizzledRead instructions also include a masking parameter that enables controlling locations, i.e., elements/lanes, in the swizzle scratch pad to where data is written or from where data is read.

In some embodiments, among the above-described instructions that cause PIM functional blocks to perform PIM operations for accessing data in the swizzle scratch pad are the PIM_SSPWrite and PIM_SSPRead instructions (called PIM_BDWrite and PIM_BDRead in some embodiments). The PIM_SSPWrite and PIM_SSPRead instructions are instructions that cause executing PIM functional blocks to write and read data in the swizzle scratch pad, respectively. For example, in some embodiments, the PIM_SSPWrite and PIM_SSPRead instructions are vector write/read instructions that cause an executing PIM functional block to write/read multiple locations, i.e., elements/lanes, of the swizzle scratch pad in parallel. The PIM_SSPWrite causes a PIM functional block to write a total of N bytes of data acquired from the respective portion of the memory (or another location accessible to the PIM functional block) into sequential locations in the swizzle scratch pad (N=256, 500, or another number). The PIM_SSPRead causes a PIM functional block to read a total of N bytes of data from sequential locations in the swizzle scratch pad and store the data into a respective portion of the memory (or another PIM functional block-accessible location). Note that the PIM_SSPWrite and PIM_SSPRead instructions write/read a chunk/block of sequential data—and do not include the additional controls of the PIM_SwizzledWrite and PIM_SwizzledRead instructions.

In some embodiments, the above-described portion-masking elements include circuitry configured to control whether (or not) the PIM functional blocks perform PIM operations. For example, in some embodiments, the portion masking elements include registers or other storage locations that include a bit associated with each PIM functional block. In these embodiments, when the corresponding bit in the portion masking elements is set (e.g., to a logical high value such as one), the PIM functional block will perform PIM operations (e.g., execute instructions, etc.). In contrast, when the corresponding bit in the portion masking elements is unset (e.g., set to a logical low value such as zero), the PIM functional block will not perform PIM operations. In some embodiments, the portion masking elements are set by a host (e.g., the processor) in response to information communicated to the host by the PIM functional blocks. In some embodiments, however, the portion masking elements are set by the memory itself (e.g., by a memory controller) based on information communicated by the PIM functional blocks.

By using the swizzle scratch pad for copying data from other portions of a memory into a respective portion of the memory for PIM functional blocks, the described embodiments enable the PIM functional blocks to perform PIM operations that use data from other portions of the memory. This makes it more efficient (and, generally, possible) for the PIM functional blocks to be used with software applications that perform memory accesses in multiple portions of the memory, i.e., perform irregular or widely spaced memory accesses. By using the PIM instructions (i.e., PIM_SwizzledRead, PIM_SSPRead, etc.) for accessing data in the swizzle scratch pad, the described embodiments enable PIM functional blocks to interact with the swizzle scratch pad without relying as heavily on input from the processor, which conserves bandwidth on a system bus and avoids unnecessary load on the processor. By using the portion-level masking, the described embodiments can control which PIM functional blocks perform PIM operations, which leads to better portion level control of PIM operations in the memory. Making the performance of PIM operations by the PIM functional blocks more efficient improves the operation of the memory and the processor, which improves the overall performance of the electronic device. Improving the overall performance of the electronic device improves user satisfaction with the electronic device.

Electronic Device

FIG. 1 presents a block diagram illustrating an electronic device 100 in accordance with some embodiments. As can be seen in FIG. 1, electronic device 100 includes processor 102 and memory 104. Generally, processor 102 and memory 104 are implemented in hardware, i.e., using corresponding integrated circuitry, discrete circuitry, and/or devices. For example, in some embodiments, processor 102 and memory 104 are implemented in integrated circuitry on one or more semiconductor chips, are implemented in a combination of integrated circuitry on one or more semiconductor chips in combination with discrete circuitry and/or devices, or are implemented in discrete circuitry and/or devices. In some embodiments, processor 102 and/or memory 104 perform operations for or associated with copying data from other portions of memory 104 into a respective portion of memory 104 for a given PIM functional block to make the data accessible to the given PIM functional block as described herein.

Processor 102 is a functional block that performs computational, memory access, control, and/or other operations. For example, processor 102 can be a central processing unit (CPU), a graphics processing unit (GPU), an accelerated processing unit, a system on a chip, a field programmable gate array, etc. Processor 102 includes a number of cores 106-112. Each core 106-112 is a functional block that performs computational, memory access, control, and/or other operations. For example, in some embodiments, each of cores 106-112 is or includes a CPU core, a GPU core, an embedded processor, an application specific integrated circuit, a microcontroller, and/or another functional block.

Memory 104 is a functional block that stores data for other functional blocks in electronic device 100. For example, in some embodiments, memory 104 is a higher capacity integrated circuit memory (e.g., a "main" memory, etc.) into which copies of data (e.g., 4 kB pages of data) retrieved from a storage device (not shown) are stored for accesses by the other functional blocks. As another example, in some embodiments, memory 104 is a high bandwidth memory, which is a higher capacity integrated circuit memory into which copies of data are stored for accesses by the other functional blocks. Memory 104 includes memory circuitry such as fourth generation double data rate synchronous dynamic random-access memory (DDR4 SDRAM) and/or other types of memory circuits, as well as control circuits for handling accesses of the data stored in the memory circuits. In some embodiments, memory 104 includes one or more stacks of DRAM dies/integrated circuit chips, or "stacked DRAM," that are used for storing data, possibly along with one or more logic/base dies/integrated circuit chips.

Memory controllers (MC) 114-122 are functional blocks that perform operations for managing memory accesses between functional blocks in processor 102 (e.g., cores 106-112) and memory 104. For example, in some embodiments, memory controllers 114-122 perform reads, writes, and/or other accesses in memory 104, perform configuration and control operations for memory circuitry in memory 104 (e.g., control data refreshes, etc.), etc. In some embodiments, some or all of memory controllers 114-122 perform operations for or associated with copying data from other portions of memory 104 into a respective portion of memory 104 for a given PIM functional block to make the data accessible to the given PIM functional block as described herein Although electronic device 100 is shown in FIG. 1 with a particular number and arrangement of elements, in some embodiments, electronic device 100 includes different numbers and/or arrangements of elements. For example, in some embodiments, electronic device 100 includes a different number of processors 102. Electronic device 100 is also simplified for illustrative purposes. In some embodiments, however, electronic device 100 includes additional and/or different elements. For example, electronic device 100 can include human interface subsystems (e.g., displays, speakers, keyboards, etc.), electrical power subsystems, input-output (I/O) subsystems, etc. Generally, in the described embodiments, electronic device 100 includes sufficient numbers and/or arrangements of elements to perform the operations herein described.

Electronic device 100 can be, or can be included in, any device that performs the operations described herein. For example, electronic device 100 can be, or can be included in, a desktop computer, a laptop computer, a wearable electronic device, a tablet computer, virtual or augmented reality equipment, a smart phone, an artificial intelligence (AI) or machine learning device, a server, a network appliance, a toy, a piece of audio-visual equipment, a home appliance, a vehicle, etc., and/or combinations thereof. In some embodiments, electronic device 100 is included on one or more semiconductor chips. For example, in some embodiments, electronic device 100 is entirely included in a single "system on a chip" (SOC) semiconductor chip, is included on one or more ASICs, etc.

Figure 2:
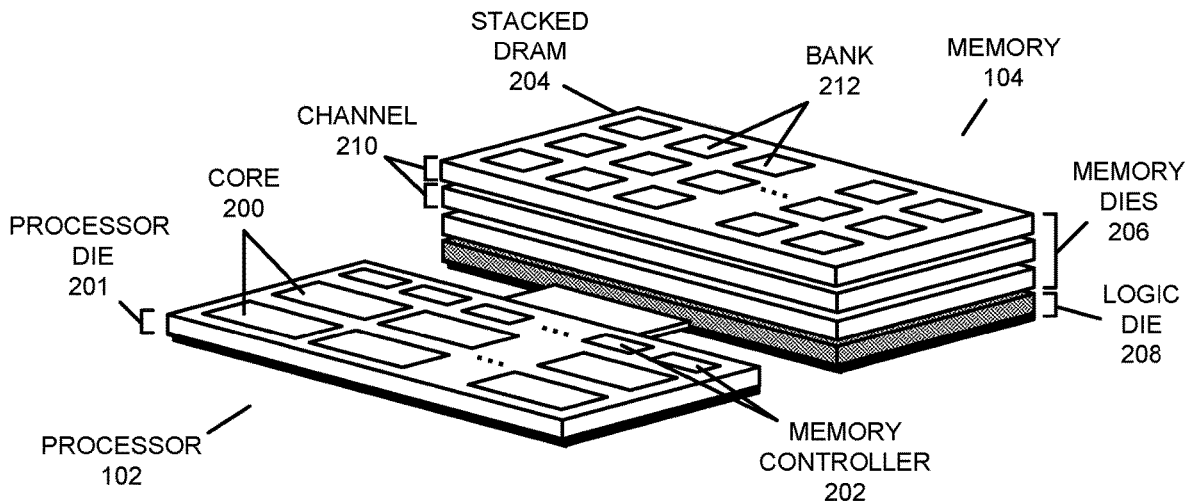
FIG. 2 presents a view of a processor and a memory in accordance with some embodiments.

FIG. 2 presents an additional view of processor 102 and memory 104 in accordance with some embodiments. More specifically, FIG. 2 presents a block diagram illustrating an isometric view of processor 102 and memory 104 in accordance with some embodiments. As can be seen in FIG. 2, processor 102 is or includes processor die 201, which is a semiconductor integrated circuit die (e.g., a semiconductor chip, etc.) upon which processor 102's circuitry is implemented. Processor 102's circuitry includes cores 200 and memory controllers 202 as described above (only a few of each are labeled in FIG. 2 for clarity). Processor 102 is connected, via a communication path (e.g., a system bus, memory bus, etc.), to a stacked DRAM module (STACKED DRAM) 204 in which the memory circuitry of memory 104 is included.

Stacked DRAM module 204 includes multiple memory dies 206 and logic die 208, which are arranged in a stack with logic die 208 at the base of the stack and memory dies 206 stacked atop logic die 208. Each memory die 206 is a semiconductor integrated circuit die that includes memory circuitry used for storing data for access by other functional blocks (e.g., processor 102), as well as memory access circuitry and other circuitry (e.g., processing circuitry such as PIM functional block 330 shown in FIG. 3, etc.). Logic die 208, which can also be called a "base" die, is a semiconductor integrated circuit die that includes processing and/or logic circuitry and interface circuitry for communicating with processor 102—and may also include memory circuitry that is used for storing data for access by other functional blocks. Memory dies 206 and logic die 208 include communication functional blocks and other functional blocks and elements (e.g., functional blocks and elements for distributing electrical power, etc.) that are electrically coupled to some or all of the neighboring dies/chips via through silicon vias (TSVs), solder bumps, optical elements, etc. For example, in some embodiments, memory dies 206 and logic die 208 include communication functional blocks and elements for a communication bus used for operations such as accessing data in memory circuitry in memory dies 206, as well as connection elements for connecting the bus between memory dies 206 and logic die 208.

In some embodiments, memory circuitry in memory 104 is logically and/or physically divided into a number of hierarchical levels with each level including some of the memory circuitry. For example, in some of these embodiments, the levels include channels and banks (and possibly other logical and/or physical levels). For the embodiment shown in FIG. 2, memory circuitry for different channels 210 of memory 104 is included on individual integrated circuit chips in stacked DRAM module 204 (only two channels 210 are labeled in FIG. 2 for clarity). In these embodiments, each of the channels 210—and thus the individual integrated circuit chips upon which the memory circuitry for the channels 210 is implemented—includes a number of banks 212 of memory circuitry (only two banks 212 are labeled in FIG. 2 for clarity). Each bank 212 includes a subset of memory circuitry on a single memory die—i.e., a subset of the memory circuitry of the respective channel 210. The size of each bank 212, and thus the quantity of memory circuits in each bank 212, is defined by a memory designer (e.g., based on electrical loads on circuit elements, sizes of memory circuitry access elements, etc.), selected based on a memory standard, and/or otherwise chosen. For example, in some embodiments, each bank includes an N×N array of memory circuitry (N=8 KiB, 16 KiB, etc.).

Although a particular arrangement of elements is illustrated in processor 102 and memory 104 in FIG. 2, in some embodiments, different elements may be present. For example, in some embodiments, another number or arrangement of stacked DRAM modules are used. For instance, in some embodiments, memory 104 is implemented using flat/not stacked DRAM dies or a combination of flat and stacked DRAM dies. Generally, the described embodiments can use any number or arrangement of functional blocks and devices that perform the operations herein described.

Portions of a Memory and Processors in Memory

Figure 3:
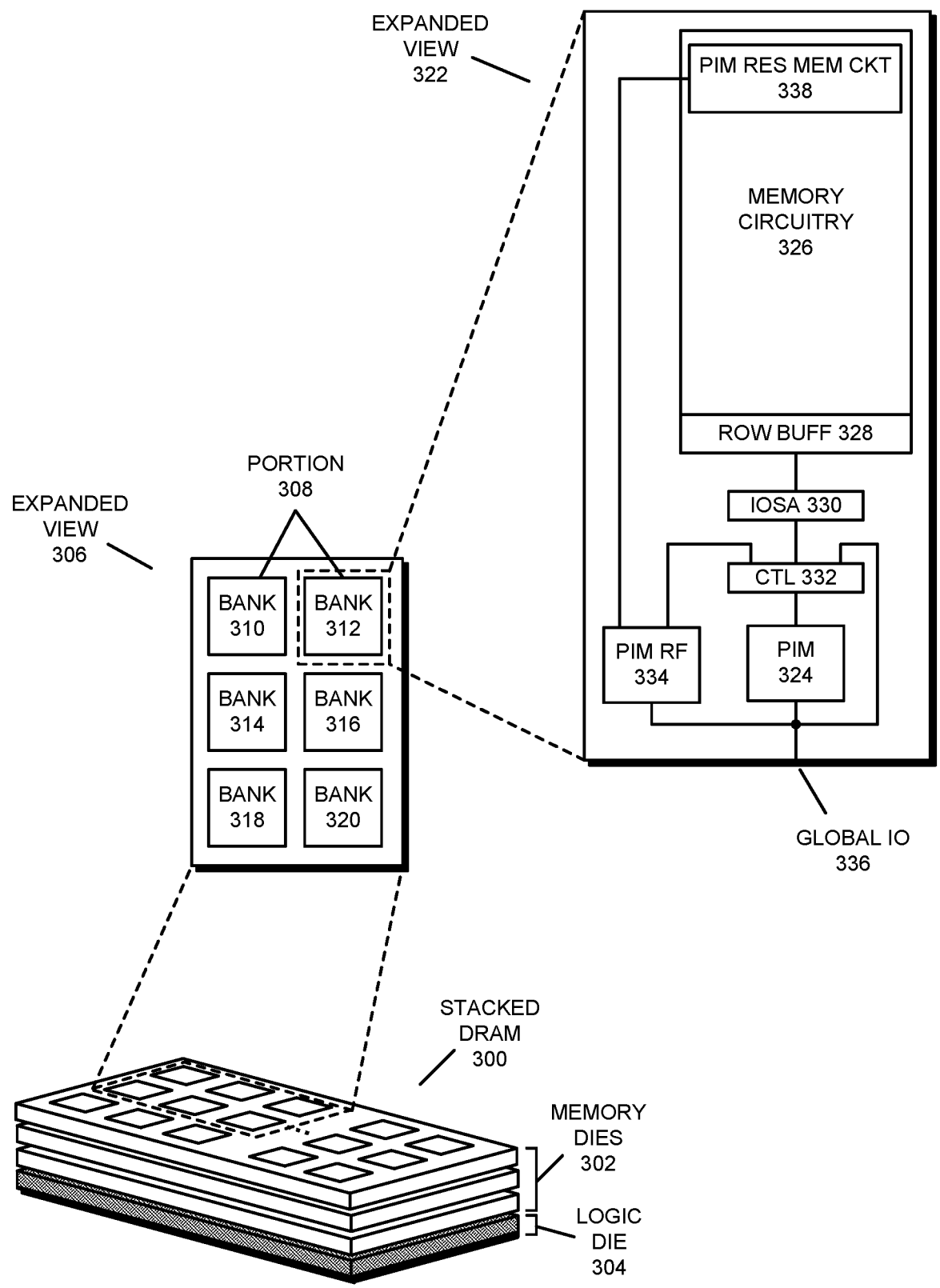
FIG. 3 presents a block diagram illustrating portions of a memory and a PIM functional block in accordance with some embodiments.

In the described embodiments, portions of a memory include processor-in-memory (PIM) functional blocks, so that each of the portions of memory has its own PIM functional block. FIG. 3 presents a block diagram illustrating portions of a memory and a PIM functional block in accordance with some embodiments. As can be seen in FIG. 3, a stacked DRAM module (STACKED DRAM) 300 includes memory dies 302 and logic die 304. In some embodiments, some or all of stacked DRAM 204—and thus a stacked DRAM module in memory 104—are organized similarly to stacked DRAM module 300 in FIG. 3.

In the described embodiments, the memory circuitry on memory dies 302 (and possibly memory circuitry on logic die 304) is logically and/or physically divided into multiple portions. Expanded view 306 shows portions 308 of memory circuitry in one of the memory dies 302 (only a two portions 308 are labeled in FIG. 3 for clarity). As can be seen in FIG. 3, each portion 308 is/includes a single bank of memory circuitry from among banks 310-320.

In the described embodiments, each portion 308 of the memory circuitry in a memory die 302 is associated with/ includes a processor in memory (PIM) functional block. Generally, PIM functional blocks are functional blocks that include circuitry configured for locally performing operations, called "PIM operations" herein, on data acquired from the respective portion 308 of the memory circuitry (or another source, such as a PIM register file, etc.) and then returning the data to the respective portion of the memory circuitry (or another destination, such as the PIM register file, etc.) after performing the PIM operations. In this way, the PIM functional blocks enable specified operations to be performed on data from or destined for the memory circuitry without the need for sending the data off of the respective memory die 302 (e.g., to a processor). Expanded view 322 in FIG. 3 shows a PIM functional block (PIM) 324 and other elements associated with a single portion 308 of the memory circuitry (i.e., bank 312). As can be seen in expanded view 322, memory circuitry 326—the memory circuitry for bank 314—is connected to a row buffer (ROW BUFF) 328 and input-output sense amplifiers (IOSA) 330. Row buffer 328 is a functional block that includes storage circuitry for storing data read from or to be written to memory circuitry 326. For example, in some embodiments, memory circuitry 326 includes DRAM memory circuitry (e.g., DDR SDRAM) and row buffer 328 is a DRAM row buffer. Input-output sense amplifiers 330 is a functional block that includes amplification circuitry for passing/driving data from row buffer 328 to downstream circuitry (i.e., control (CTL) 332, etc.). Input-output sense amplifiers 330 is connected to control 332, which is a functional block that selects a data source (or data sources) from which data is fed into PIM functional block 324. The data sources for control 332 include: (1) data acquired from memory circuitry 326 and passed through row buffer 328 and input-output sense amplifiers 328; (2) data fed back from an output of PIM functional block 324; and (3) data acquired from PIM register file 334.

PIM functional block 324 is a functional block that performs PIM operations on data received from control 332. For example, in some embodiments, PIM functional block 324 includes an arithmetic logic unit (ALU) that performs mathematical, bitwise/logical, and other operations on the data. As another example, in some embodiments, PIM functional block 324 includes instruction execution circuitry that executes PIM instructions (e.g., the PIM_SwizzledWrite, PIM_SwizzledRead, PIM_SSPWrite, and PIM_SSPRead instructions as described herein, possibly as well as other PIM instructions) that cause PIM functional block 324 to perform corresponding operations on data. In some embodiments, the instruction execution circuitry in PIM functional block 324 receives and identifies PIM instructions (e.g., by decoding the PIM instructions, interpreting the PIM instructions, etc.) and then executes the PIM instructions in corresponding execution circuitry. In some embodiments, the execution circuitry includes dedicated circuitry for executing each PIM instruction. In some embodiments, the execution circuitry includes one or more instruction execution pipelines.

After performing PIM operations during which result data is generated, PIM functional block 324 communicates the resulting data to PIM register file (RF) 334 and/or to global input-output (GLOBAL IO) 336. Data communicated to PIM register file 334 can be stored in register(s) in PIM register file 334, from where the data can be forwarded to control 332 to again serve as input data for PIM functional block 324 and/or written back to memory circuitry 326. In some embodiments, some or all of the data from PIM register file 334 is stored in PIM reserved memory circuitry (PIM RES MEM CKT) 344, which is a block of memory circuitry 338 that is reserved for this purpose. Data communicated to global input-output 336 is communicated to other portions 308 of the memory (e.g., bank 310, etc.) and/or to destinations off of memory die 302.

Although memory dies 302 and logic die 304 are described as including certain circuitry, in some embodiments, memory dies 302 and/or logic die 304 include different circuitry. For example, in some embodiments, memory circuitry 326 is implemented using memory circuitry other than DRAM. In addition, for the example shown in FIG. 3, stacked DRAM 300 is used for explaining the arrangement of elements in some embodiments. In other embodiments, however, different numbers and/or arrangements of elements are used. For example, in some embodiments, the memory dies and/or logic dies are not stacked, but are instead wholly or partially laid out in a single layer (e.g., alongside one another). As another example, in some embodiments, there is no separate logic die 304, but instead stacked DRAM 300 is composed entirely of memory dies (with PIM functional blocks and other processing and communication circuitry included thereon). Generally, in the described embodiments, a memory (e.g., memory 104, etc.) and the PIM functional blocks located therein include sufficient functional blocks to perform the operations described herein.

Swizzle Scratch Pad

Figure 4:
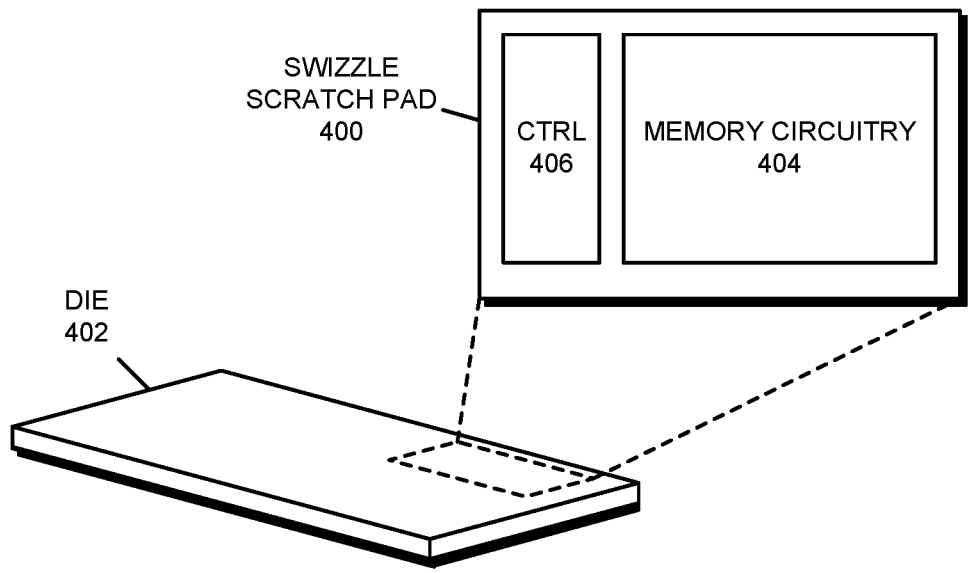
FIG. 4 presents a block diagram illustrating a swizzle scratch pad in accordance with some embodiments.

In some embodiments, PIM functional blocks (and possibly other functional blocks or devices) perform operations for or associated with copying data from respective portions of a memory (or other sources for PIM functional blocks) to other portions of the memory (or other destinations for PIM functional blocks). For copying the data, PIM functional blocks use a swizzle scratch pad as an intermediary. Generally, the swizzle scratch pad includes memory circuitry used for storing data received from a PIM functional block (or another functional block or device) so that the PIM functional block and/or other PIM functional blocks can acquire the data from the swizzle scratch pad and store the data in the respective portion of the memory (or in another location for the PIM functional block). FIG. 4 presents a block diagram illustrating a swizzle scratch pad in accordance with some embodiments.

As can be seen in FIG. 4, swizzle scratch pad 400 is located on die 402, i.e., is fabricated on a semiconductor integrated circuit die. Swizzle scratch pad 400 includes memory circuitry 404 and controller 406. Memory circuitry 404 is a functional block having memory circuitry (e.g., DRAM memory circuitry, etc.) that is used for storing data received from PIM functional blocks (and possibly other functional blocks or devices). Controller 406 is a functional block that performs operations for accessing data in memory circuitry 404, i.e., for writing data to and reading data from memory circuitry 404.

In some embodiments, controller 406 uses mask information to determine which parts/elements of data are stored in and read from memory circuitry 404. For example, controller 406 may perform vector writes, for which data received from a PIM functional block is written to memory circuitry 404 using vector write circuitry that has one or more lanes, each lane writing a given number of bits or bytes to memory circuitry 404. For example, for writing 256 bits of data (i.e., 32 bytes), each lane can write four bytes and thus controller 406 can have eight lanes. In these embodiments, based on the mask information, each lane can be separately enabled/disabled for each write operation (e.g., clock gated, powered down, blocked using blocking circuit elements such as multiplexers, etc.). Controller 406 may also perform vector reads—and may use similar vector read circuitry with one or more lanes for controlling which data is read from memory circuitry 404 based on mask information. In some embodiments, the mask information is provided by PIM functional blocks, a memory controller, a processor, and/or another functional block.

In some embodiments, swizzle scratch pad 400 is placed in a location that is accessible to PIM functional blocks in multiple, and typically all, portions of the memory on all the dies. This placement of the swizzle scratch pad enables the portions of the memory to use the swizzle scratch pad as described herein. For example, in embodiments with stacked DRAM 300 (i.e., where memory 104 includes a stacked DRAM module), the swizzle scratch pad can be placed on a logic die 304 (i.e., a base die). As described above, in some embodiments, logic die 304 includes bus interface circuitry for communicating data on/off of stacked DRAM 300 and is therefore a die with which other dies (i.e., memory dies 302) can communicate.

Although swizzle scratch pad 400 is shown in FIG. 4 as including particular functional blocks, in some embodiments, swizzle scratch pad 400 includes different functional blocks. Generally, in the described embodiments, swizzle scratch pad 400 includes sufficient functional blocks to perform the operations herein described. In addition, although memory circuitry 404 and/or controller 406 are described as performing certain operations, in some embodiments, memory circuitry 404 and controller 406 perform different and/or additional operations. For example, in some embodiments, mask information is processed in the PIM functional block—and thus PIM functional blocks limit the elements in data that are written to memory circuitry 404.

Using a Swizzle Scratch Pad for Copying Data Between Portions of a Memory

Figure 5:
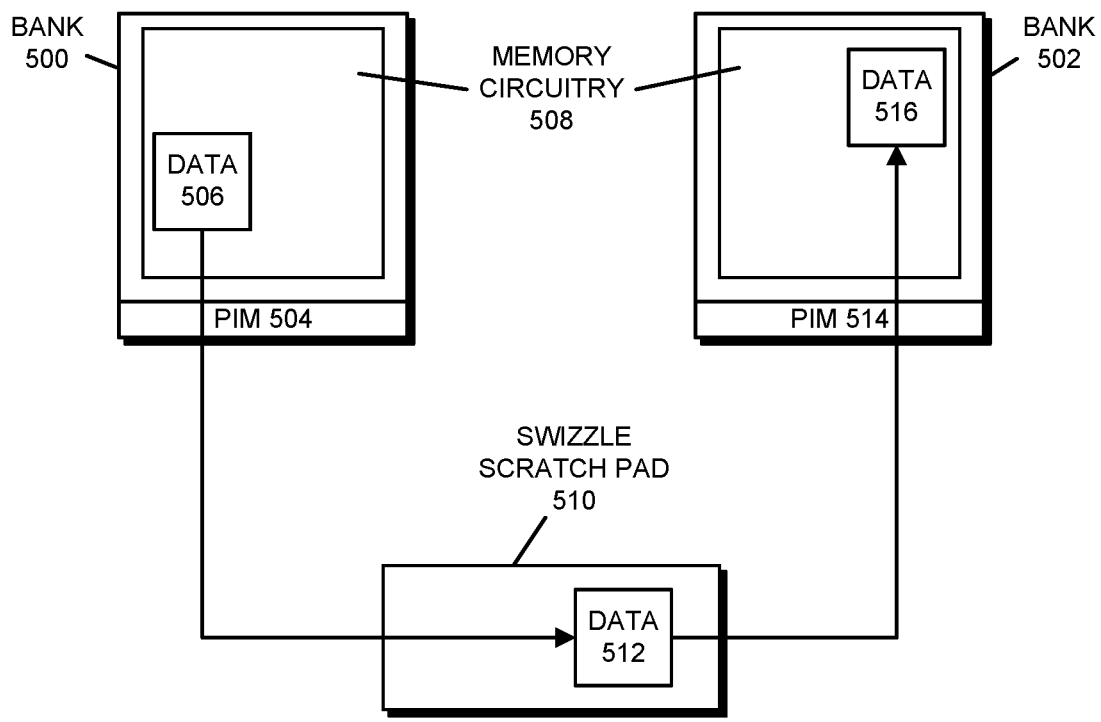
FIG. 5 presents a block diagram illustrating copying data between portions of a memory using a swizzle scratch pad in accordance with some embodiments.

In the described embodiments, a swizzle scratch pad (e.g., swizzle scratch pad 400) is used for copying data between portions of a memory. FIG. 5 presents a block diagram illustrating copying data between portions of a memory using a swizzle scratch pad in accordance with some embodiments.

For the example in FIG. 5, banks 500-502 are used as examples of portions of memory (e.g., portions 408 such as banks 410-412, etc.). In some embodiments, however, different portions of memory are used (e.g., channels, modules, ranks, etc.). Generally, the described embodiments are operable with any portions of memory that are associated with PIM functional blocks. Although an example is presented in FIG. 5 in which a memory to memory copy is performed by PIM functional blocks, in some embodiments, the source location and/or the destination locations are different. For example, in some embodiments, in addition to the memory circuitry in bank 500, the source locations include PIM register files and a global input-output (e.g., global input-output 442) for PIM functional block 504 (neither of which is shown in FIG. 5 for clarity). As another example, in some embodiments, in addition to memory circuitry in bank 502, the destination locations include PIM register files.

The operations shown in FIG. 5 start when PIM functional block 504 in bank 500 copies data 506 from the respective portion of memory to swizzle scratch pad 510. For this operation, in some embodiments, PIM functional block 504 executes an instruction that causes PIM functional block 504 to acquire data 506 (e.g., T bits of data, where T=256, 500, or another number) from memory circuitry 508 in bank 500. PIM functional block 504 then stores data 506 as data 512 in swizzle scratch pad 510. For example, PIM functional block 504 may execute a PIM_SSPWrite instruction that causes PIM functional block 504 to copy data 506 to swizzle scratch pad 510 without modification—i.e., as a single block of contiguous data 512. As another example, PIM functional block 504 may execute a PIM_SwizzledWrite instruction that causes PIM functional block 504 to copy data 506 to a specified location in swizzle scratch pad 510, as modified using masking information. In this case, a controller (e.g., controller 406) in swizzle scratch pad 510 uses masking information communicated from PIM functional block 504 to swizzle scratch pad 510 or otherwise acquired by the controller (e.g., from a masking register) for masking lanes or otherwise preventing certain elements/parts of data 506 from being written in swizzle scratch pad 510 as data 512. At the conclusion of this operation, data 512 is available in swizzle scratch pad 510 for acquisition by other PIM functional blocks.

After PIM functional block 504 writes data 512 to swizzle scratch pad 510, PIM functional block 514 in bank 502 acquires data 512 from swizzle scratch pad 510 and stores the data in the respective portion of the memory. For this operation, in some embodiments, PIM functional block 514 executes an instruction that causes PIM functional block 514 to acquire data 512 (e.g., T bits of data, where T=256, 500, or another number) from swizzle scratch pad 510. PIM functional block 514 then stores data 512 as data 516 in the respective portion of the memory. For example, PIM functional block 514 may execute a PIM_SSPRead instruction that causes PIM functional block 514 to copy data 512 from swizzle scratch pad 510 without modification—i.e., as a single block of contiguous data 516. As another example, PIM functional block 514 may execute a PIM_SwizzledWrite instruction that causes PIM functional block 514 to copy data 512 from a specified location in swizzle scratch pad 510, as modified using masking information. In this case, the controller in swizzle scratch pad 510 will use masking information communicated from PIM functional block 514 to swizzle scratch pad 510 or otherwise acquired by the controller (e.g., from a masking register) for masking lanes or otherwise preventing certain elements/parts of data 512 from being read from swizzle scratch pad 510. At the conclusion of this operation, data 516 is available in memory circuitry 508 in bank 502 for use by PIM functional block 514.

Process for Copying Data Between Portions of a Memory

Figure 6:
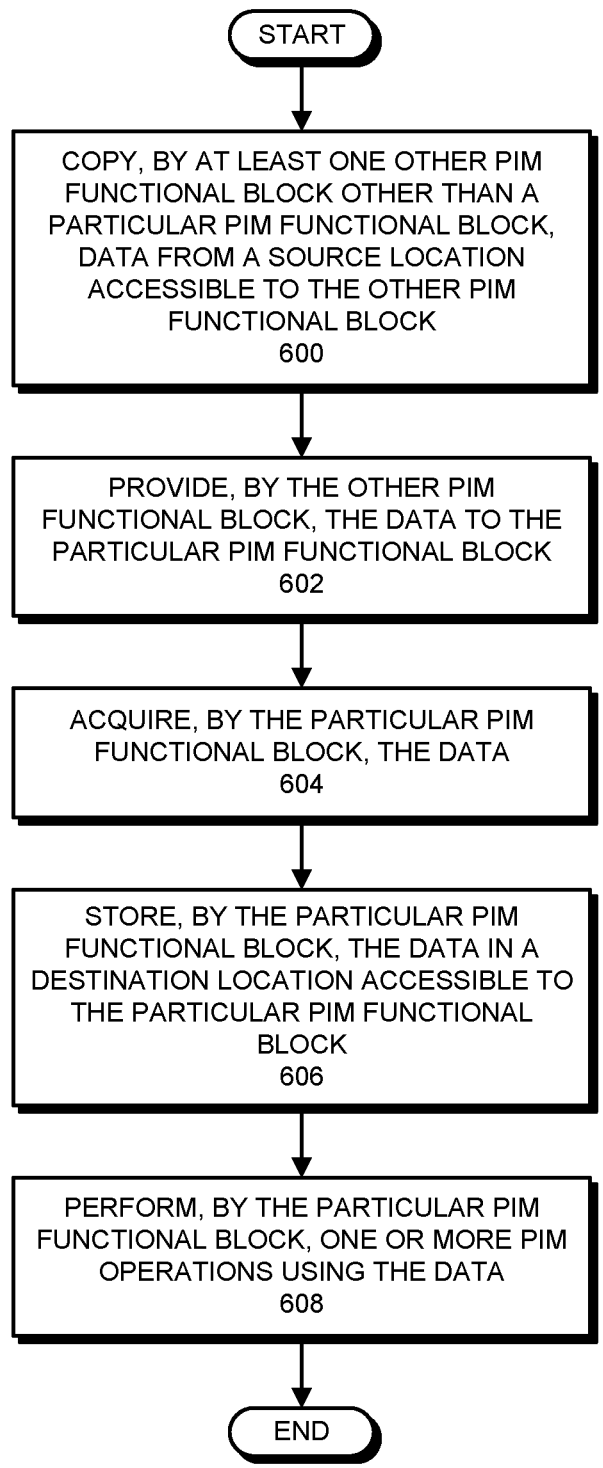
FIG. 6 presents a flowchart illustrating a process for copying data between portions of a memory in accordance with some embodiments.

In the described embodiments, PIM functional blocks in a memory (e.g., high bandwidth memory 106) perform operations for copying data between portions of the memory (e.g., portions 408, etc.). FIG. 6 presents a flowchart illustrating a process for copying data between portions of a memory in accordance with some embodiments. FIG. 6 is presented as a general example of operations performed in some embodiments. In other embodiments, however, different operations are performed and/or operations are performed in a different order. Additionally, although certain elements are used in describing the process (e.g., a PIM functional blocks, a swizzle scratch pad, etc.), in some embodiments, other elements perform the operations. For the operations in FIG. 6, an embodiment is assumed in which a memory includes a number of portions (e.g., portions 408), each portion including/associated with a PIM functional block (e.g., PIM functional block 430).

The process shown in FIG. 6 starts when at least one other PIM functional block other than a particular functional block copies data from a source location accessible to the other PIM functional block (step 600). For this operation, the at least one other PIM functional block copies data from a source location such as a respective portion of memory for the other PIM functional block, a PIM register for the other PIM functional block, or a global input-output for the PIM functional block. The other PIM functional block then provides the data to the particular PIM functional block (step 602). For this operation, the other PIM functional block makes the data available to the particular PIM functional block by copying the data to a swizzle scratch pad (e.g., swizzle scratch pad 400). For example, in some embodiments, for steps 600-602, the other PIM functional block executes a PIM instruction such as a PIM_SwizzledWrite or PIM_SSPWrite instruction, the instruction causing the PIM to perform the copying and providing operations using the swizzle scratch pad.

The particular PIM functional block then acquires the data (step 604) and stores the data in a destination location accessible to the particular PIM functional block (step 606). For this operation, the particular PIM functional block copies the data from the swizzle scratch pad and writes the data into a destination location such as the respective portion of the memory for the particular PIM functional block or a PIM register file for the particular PIM functional block. For example, in some embodiments, for steps 604-606, the particular PIM functional block executes a PIM instruction such as a PIM_SwizzledRead or PIM_SSPRead instruction, the instruction causing the PIM to perform the acquiring and storing operations using the swizzle scratch pad.

The particular PIM functional block then performs one or more PIM operations using the data (step 608). For this operation, the particular PIM functional block uses the data from the destination location (e.g., the respective portion of the memory, etc.) to perform PIM operations such as mathematical, bitwise/logical, and/or other operations. In some embodiments, the particular PIM functional block executes one or more PIM instructions that use the data as an input, control value, lane mask (e.g., when PIM executes a single-instruction, multiple-data (SIMD) vector instruction using multiple parallel and individually maskable lanes of execution circuitry), etc.

Processor in Memory Instructions

In some embodiments, PIM functional blocks execute instructions for accessing data in a swizzle scratch pad. FIGS. 7-10 present block diagrams illustrating PIM instructions for PIM functional blocks in accordance with various embodiments. Generally, PIM instructions can be retrieved by PIM functional blocks from the memory (e.g., from respective portions of the memory or elsewhere in the memory) or other storage locations and/or received by PIM functional blocks from a memory controller, another PIM functional block, and/or other sources. The PIM functional blocks process received PIM instructions to prepare the PIM instructions for execution and then execute the PIM instructions, which causes the PIM functional blocks to perform corresponding operations. For example, in some embodiments, the PIM functional blocks decode or interpret PIM instructions in decoding circuitry in the PIM functional blocks and then execute the decoded PIM instructions in instruction execution circuitry in the PIM functional blocks.

In the following description of PIM instructions, each of the instructions is assumed to be embodied as a number of bits organized into separate fields, each field including part of the information for the PIM instruction. Each of the fields includes a number of bits so that decoding circuitry and/or other circuitry in PIM functional blocks can identify/find the information in the fields. For example, in some embodiments, the instruction identifier 702 field in PIM_SSPWrite instruction 700 includes six bits (or another number of bits). In some embodiments, the number of bits in some or all of the fields in PIM instructions is not fixed, but depends on the particular information in the fields and/or in other fields. Generally, the PIM instructions include fields that include the information described herein.

Figure 7:
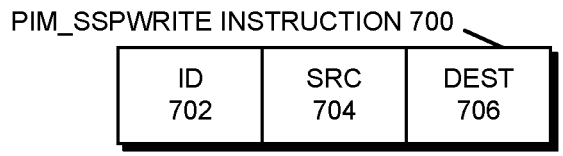
FIG. 7 presents a block diagram illustrating a PIM_SSP-Write instruction in accordance with some embodiments.

FIG. 7 presents a block diagram illustrating a PIM_SSPWrite instruction 700 in accordance with some embodiments. When executed by a PIM functional block, the PIM_SSPWrite instruction 700 causes the PIM functional block to acquire a copy of a block of data of a given size (i.e., X bits, where X=256, 500, or another number) from a source location for the PIM functional block and write the data to a contiguous block in the swizzle scratch pad. The PIM_SSPWrite instruction 700 includes an instruction identifier (ID) 702, a source identifier (SRC) 704, and a destination identifier (DEST) 706. Instruction identifier 702 includes information identifying PIM_SSPWrite instruction 700 among a set of PIM instructions that can be executed by PIM functional blocks. For example, in some embodiments, instruction identifier 702 is or includes an opcode. Source 704 includes information identifying a particular source location from where a copy of data is to be acquired from among a set of source locations for the PIM functional block. For example, in some embodiments, the source locations for the PIM functional block include the respective portion of the memory for the PIM functional block (e.g., in memory circuitry 432) and a register in a PIM register file (e.g., PIM register file 420)—and may include other locations. Destination 706 includes information identifying the swizzle scratch pad as the destination for the data to be copied. In some embodiments, the PIM_SSPWrite instruction is called PIM_BDWrite.

Figure 8:
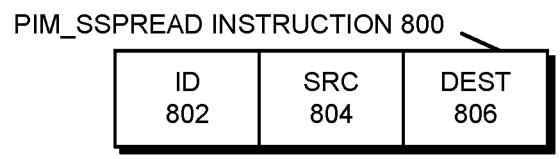
FIG. 8 presents a block diagram illustrating a PIM_SSPRead instruction in accordance with some embodiments.

FIG. 8 presents a block diagram illustrating a PIM_SSPRead instruction 800 in accordance with some embodiments. When executed by a PIM functional block, the PIM_SSPRead instruction 800 causes the PIM functional block to read a contiguous block of data of a given size (i.e., X bits, where X=256, 500, or another number) from the swizzle scratch pad and write the data to a destination location for the PIM functional block. The PIM_SSPRead instruction 800 includes an instruction identifier (ID) 802, a source identifier (SRC) 804, and a destination identifier (DEST) 806. Instruction identifier 802 includes information identifying PIM_SSPRead instruction 800 among a set of PIM instructions that can be executed by PIM functional blocks. For example, in some embodiments, instruction identifier 802 is or includes an opcode. Source 804 includes information identifying the swizzle scratch pad as the source for the data to be copied. Destination 806 identifies a destination location to where the data is to be written from among a set of destination locations for data for the PIM functional block. For example, in some embodiments, the destination locations for the PIM functional block include the respective portion of the memory for the PIM functional block (e.g., in memory circuitry 432) and a PIM register file (e.g., PIM register file 440)—and may include other locations. In some embodiments, the PIM_SSPRead instruction is called PIM_BDRead.

Figure 9:
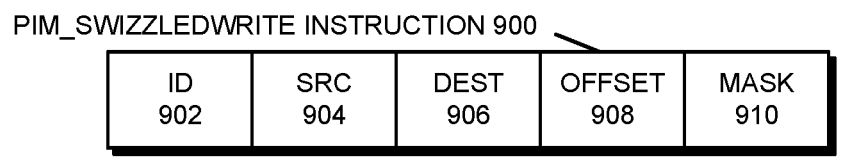
FIG. 9 presents a block diagram illustrating a PIM_SwizzledWrite instruction in accordance with some embodiments.

FIG. 9 presents a block diagram illustrating a PIM_SwizzledWrite instruction 900 in accordance with some embodiments. When executed by a PIM functional block, the PIM_SwizzledWrite instruction 900 causes the PIM functional block to acquire a copy of a block of data of a given size (i.e., X bits, where X=256, 500, or another number) from a source location for the PIM functional block and write the data to the swizzle scratch pad at a location specified by an offset and as masked using masking information. The PIM_SwizzledWrite instruction 900 includes an instruction identifier (ID) 902, a source identifier (SRC) 904, a destination identifier (DEST) 906, an offset identifier (OFFSET) 908, and a mask identifier (MASK) 910. Instruction identifier 902 includes information identifying PIM_SwizzledWrite instruction 900 among a set of PIM instructions that can be executed by PIM functional blocks. For example, in some embodiments, instruction identifier 902 is or includes an opcode. Source 904 includes information identifying a particular source location from where a copy of data is to be acquired from among a set of source locations for the PIM functional block. For example, in some embodiments, the source locations for the PIM functional block include the respective portion of the memory for the PIM functional block (e.g., in memory circuitry 432), a register in a PIM register file (e.g., PIM register file 440), and a global input-output (10) for the PIM functional block—and may include other locations. Destination 906 includes information identifying the swizzle scratch pad as the destination for the data to be copied. Offset 908 includes information identifying an offset within the swizzle scratch pad to where the data is to be written. For example, in some embodiments, offset 908 includes information about a number of bits from an origin of the swizzle scratch pad, an identifier for a register or other storage location in which is stored offset information, etc. Mask 910 includes information identifying a mask to be used when copying data to the swizzle scratch pad. For example, in some embodiments, data is written to the swizzle scratch pad in parallel in a number of lanes, each lane writing data for an element of a given size (e.g., four bytes)—and mask 910 includes information about lanes that are to be enabled (or disabled) when writing the data for the PIM_SwizzledWrite instruction.

Figure 10:
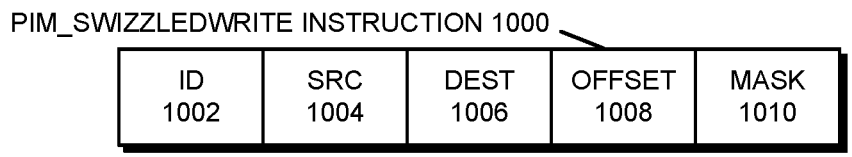
FIG. 10 presents a block diagram illustrating a PIM_SwizzledRead instruction in accordance with some embodiments.

FIG. 10 presents a block diagram illustrating a PIM_SwizzledRead instruction 1000 in accordance with some embodiments. When executed by a PIM functional block, the PIM_SwizzledRead instruction 1000 causes the PIM functional block to acquire a copy of a block of data of a given size (i.e., X bits, where X=256, 500, or another number) from the swizzle scratch pad at a location specified by an offset and as masked using masking information and write the data to a destination location for the PIM functional block. The PIM_SwizzledRead instruction 1000 includes an instruction identifier (ID) 1002, a source identifier (SRC) 1004, a destination identifier (DEST) 1006, an offset identifier (OFFSET) 1008, and a mask identifier (MASK) 1010. Instruction identifier 1002 includes information identifying PIM_SwizzledRead instruction 1000 among a set of PIM instructions that can be executed by PIM functional blocks. For example, in some embodiments, instruction identifier 1002 is or includes an opcode. Source 1004 includes information identifying the swizzle scratch pad as the source for the data to be copied. Destination 1006 identifies a destination location to where the data is to be written from among a set of destination locations for data for the PIM functional block. For example, in some embodiments, the destination locations for the PIM functional block include the respective portion of the memory for the PIM functional block (e.g., in memory circuitry 432) and a PIM register file (e.g., PIM register file 440)—and may include other locations. Offset 1008 includes information identifying an offset within the swizzle scratch pad from where the data is to be read. For example, in some embodiments, offset 1008 includes information about a number of bits from an origin of the swizzle scratch pad, an identifier for a register or other storage location in which is stored offset information, etc. Mask 1010 includes information identifying a mask to be used when copying data from the swizzle scratch pad to the destination location for the PIM functional block. For example, in some embodiments, data is read from the swizzle scratch pad in parallel in a number of lanes, each lane reading data for an element of a given size (e.g., four bytes)—and mask 1010 includes information about lanes that are to be enabled (or disabled) when reading the data for the PIM_SwizzledRead instruction.

Masking for Processor in Memory Functional Blocks

Figure 11:
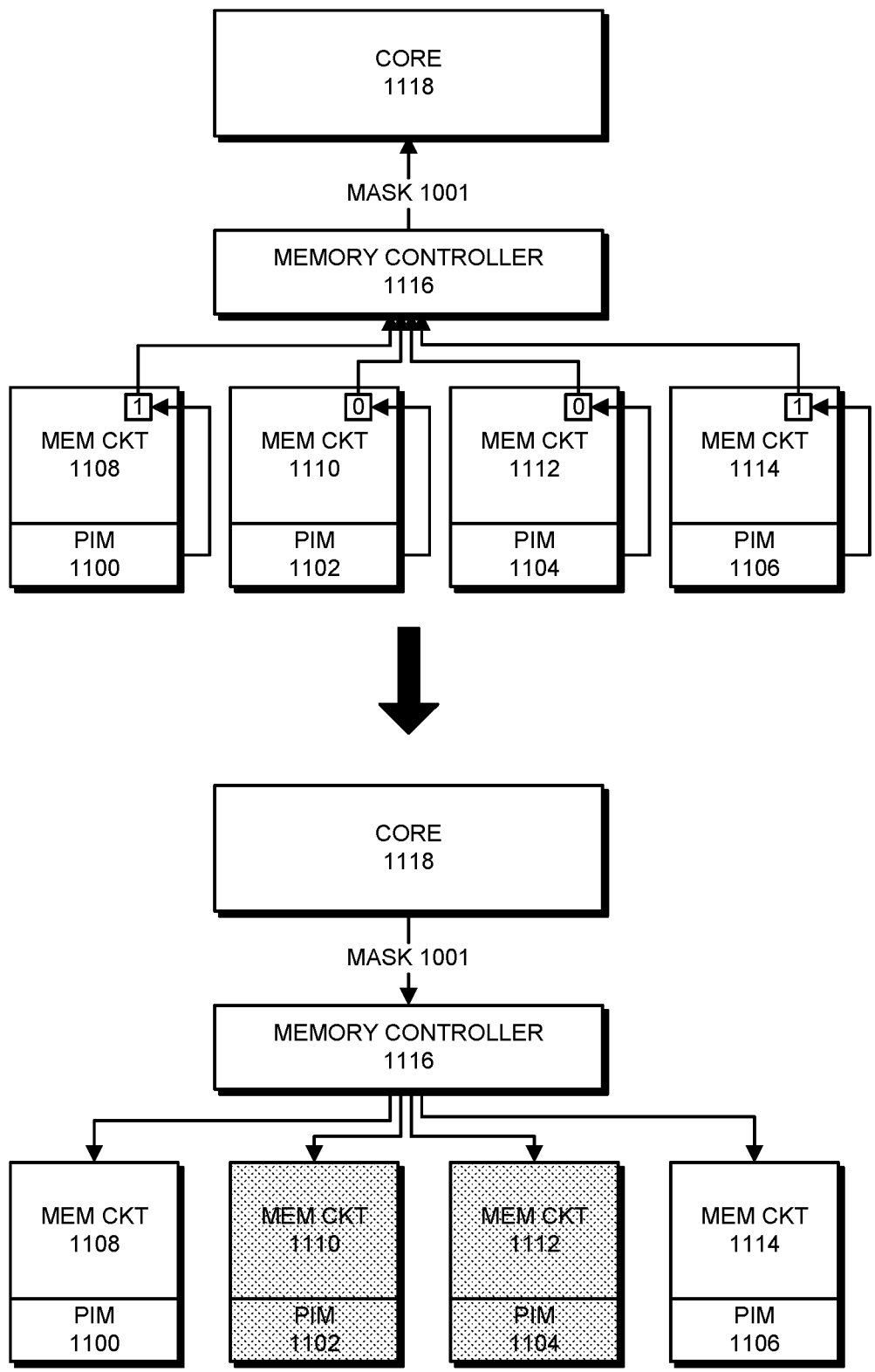
FIG. 11 presents a block diagram illustrating operations for masking PIM functional blocks in accordance with some embodiments.

In the described embodiments, PIM functional blocks perform PIM operations such as ALU operations, bitwise/logical operations, executing PIM instructions, etc. In some embodiments, the memory includes masking circuitry that is used for selecting PIM functional blocks that are to perform PIM operations. In other words, the masking circuitry can be used for controlling PIM functional blocks that perform (or do not perform) PIM operations. Generally, the masking circuitry includes or is associated with control circuitry in each PIM functional block that controls whether that PIM functional block performs PIM operations. For example, the control circuitry in each PIM functional block can include clock gating elements, power control circuitry, input and/or output select circuit elements, control registers, enable/disable inputs, etc. that control whether or not that PIM functional block performs PIM operations. When the control circuitry in a PIM functional block is set/configured to prevent that PIM functional block from performing PIM operations, the PIM functional block will not perform PIM operations (and may remain idle). Using the control circuitry to mask the PIM functional blocks, the memory can broadcast a given PIM operation to all PIMs and only unmasked PIMs will perform the PIM operation. FIG. 11 presents a block diagram illustrating operations for masking PIM functional blocks in accordance with some embodiments.

For the operations in FIG. 11, PIM functional blocks 1100-1106 are located in portions of memory having respective memory circuitry 1108-1114. For example, in some embodiments, the portions of memory are banks of memory. The masking described for FIG. 11 can therefore be considered "bank masking," as individual banks and the PIM functional blocks located therein are masked—and thereby prevented from performing PIM operations. In other words, in these embodiments, masking is performed at the memory bank level, so that control is asserted over which banks—and the PIM functional blocks therein—participate in PIM operations. In other embodiments, however, other portions of memory are used (e.g., channels, ranks, etc.). Generally, in the described embodiments, any portion of memory having a PIM functional block can be masked to avoid that portion of memory performing PIM operations.

The operations in FIG. 11 start, as shown in the top half of FIG. 11, when PIM functional blocks 1100-1106 write mask information to memory circuitry 1108-1114, respectively. For this operation, PIM functional blocks 1100-1106 write respective values to specified memory locations in memory circuitry 1108-1114 where mask information is stored for retrieval by memory controller 1116. The mask information identifies whether that PIM functional block is to be masked during the performance of subsequent PIM operations. As can be seen in FIG. 11, the mask information written by PIM functional blocks 1100 and 1106 is shown as "1," which indicates that the PIM functional blocks are not to be masked and thus are to perform subsequent PIM operations. In contrast, the mask information written by PIM functional blocks 1102 and 1104 is shown as "0," which indicates that these PIM functional blocks are to be masked for performing subsequent PIM operations. Memory controller 1116 retrieves the mask information from each of the locations and provides the mask information (shown as MASK 1001) to core 1118 (e.g., one of cores 106-112). For example, memory controller 1116 can retrieve the mask information and provide the mask information to core 1118 upon receiving a read request from core 1118, upon determining that the locations have been written, upon receiving a request from a PIM functional block, etc.

The operations of FIG. 11 then continue, as shown in the bottom half of FIG. 11, when core 1118 communicates a command to memory controller 1116 to configure PIM functional blocks 1100-1106 as identified in mask information (shown as MASK 1001). The memory controller then sets masking circuitry in each PIM functional block so that the masked PIM functional blocks do not perform subsequent PIM operations. This is shown in FIG. 11 via shading for PIM functional blocks 1102-1104, which are masked—and therefore will not perform PIM operations. Note that PIM functional blocks 1100 and 1106 are unmasked and therefore shown without shading—and will perform PIM operations. In some embodiments, masks can be set and unset dynamically—and can be used for zero or more PIM operations. In other words, the masks can be set for the PIM functional blocks, zero or more PIM operations can be performed by unmasked PIM functional blocks (and not performed by masked PIM functional blocks), and the masks can be unset/cleared to restore all PIM functional blocks to performing PIM operations.

Although an embodiment is described for FIG. 11 in which mask information is communicated from memory controller 1116 to core 1118 and back to memory controller 1116, in some embodiments, mask information is handled differently. For example, in some embodiments, memory controller 1116 itself handles the setting of the masks for the PIM functional blocks without communicating mask information to the core 1118. In some of these embodiments, core 1118 instructs memory controller 1116 to locally handle the setting of the masks based on mask information from the PIM functional blocks. These embodiments can avoid at least some masking-related communication traffic between memory controller 1116 and core 1118.

Although the masking information is shown as being stored by the PIM functional blocks in the memory circuitry in a respective portion of the memory, in some embodiments, masking information is not stored in memory by the PIM functional blocks. For example, in some embodiments, masking information registers in a logic/base die are used for storing masking information. In some of these embodiments, the masking information registers are located on the same die as the swizzle scratch pad. In these embodiments, the above described operations are adjusted so that the masking information is accessed in the masking information registers.

Although an example is presented in which each of the PIM functional blocks sets its own masking information, in some embodiments, PIM functional blocks can set masking information for other PIM functional blocks. For example, in embodiments in which the masking information is stored in registers in the logic/base die (and is therefore accessible to all the PIM functional blocks), PIM functional blocks can set the masking information for themselves and other PIM functional blocks. In this way, one or more PIM functional blocks can control the masking for all of the PIM functional blocks—and thus which PIM functional blocks will perform PIM operations.

Process for Masking Processor in Memory Functional Blocks

Figure 12:
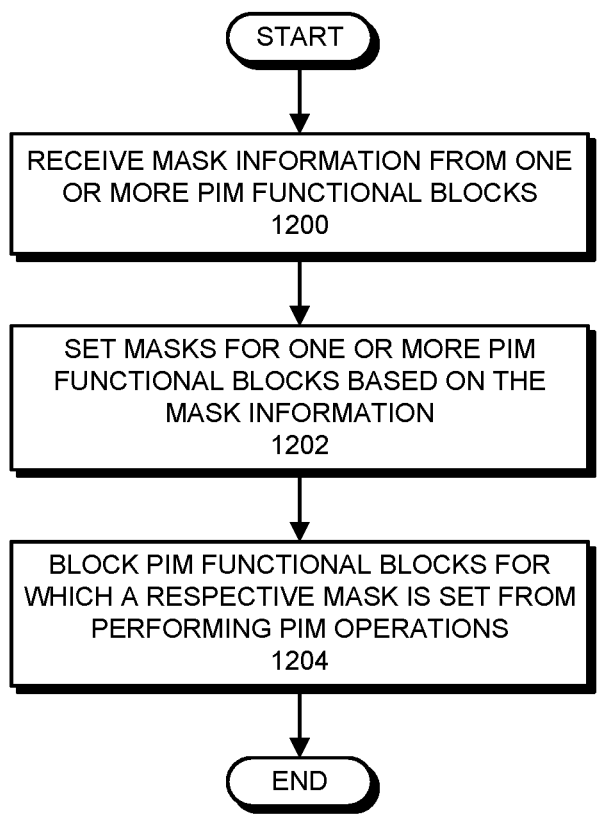
FIG. 12 presents a flowchart illustrating a process for using masking to prevent PIM functional blocks from performing PIM operations in accordance with some embodiments.

In some embodiments, masks are used for controlling which PIM functional blocks perform PIM operations. In these embodiments, masks can be set for PIM functional blocks in order to prevent the PIM functional blocks from performing PIM operations—and cleared to enable the PIM functional blocks to perform PIM operations. FIG. 12 presents a flowchart illustrating a process for using masking to prevent PIM functional blocks from performing PIM operations in accordance with some embodiments. FIG. 12 is presented as a general example of operations performed in some embodiments. In other embodiments, however, different operations are performed and/or operations are performed in a different order. Additionally, although certain elements are used in describing the process (e.g., a PIM functional blocks, etc.), in some embodiments, other elements perform the operations.

For the operations in FIG. 12, an embodiment similar to that shown in FIG. 11 is used as an example. A processor core is therefore involved in setting masks for PIM functional blocks and PIM functional blocks store mask information in respective portions of the memory. In other embodiments, however, the processor core is not directly involved in setting masks, but instead offloads this task to the memory controller (as described above). In addition, in other embodiments, the PIM functional blocks do not store mask information in the respective portion of the memory, but instead store mask information in mask information registers in a logic/base die or elsewhere.

As can be seen in FIG. 12, the process starts when a core receives mask information from one or more PIM functional blocks (step 1200). For this operation, a memory controller reads the mask information from a respective portion of the memory for each of two or more PIM functional blocks and provides the mask information to the core. The core then sets masks for one or more PIM functional blocks based on the mask information (step 1202). For example, the core can cause memory controller to update masking bits in masking circuitry in PIM functional blocks. PIM functional blocks for which a respective mask is set are then blocked/prevented from performing subsequent PIM operations (step 1204). For this operation, PIM functional blocks are prevented (e.g., via clock gating, disabling inputs, etc.) from performing PIM operations such as ALU operations, executing PIM instructions, etc.

In some embodiments, at least one electronic device (e.g., electronic device 100, etc.) or some portion thereof uses code and/or data stored on a non-transitory computer-readable storage medium to perform some or all of the operations described herein. More specifically, the at least one electronic device reads code and/or data from the computer-readable storage medium and executes the code and/or uses the data when performing the described operations. A computer-readable storage medium can be any device, medium, or combination thereof that stores code and/or data for use by an electronic device. For example, the computer-readable storage medium can include, but is not limited to, volatile and/or non-volatile memory, including flash memory, random access memory (e.g., DDR5 DRAM, SRAM, eDRAM, etc.), non-volatile RAM (e.g., phase change memory, ferroelectric random access memory, spin-transfer torque random access memory, magnetoresistive random access memory, etc.), read-only memory (ROM), and/or magnetic or optical storage mediums (e.g., disk drives, magnetic tape, CDs, DVDs, etc.).

In some embodiments, one or more hardware modules perform the operations described herein. For example, the hardware modules can include, but are not limited to, one or more central processing units (CPUs)/CPU cores, graphics processing units (GPUs)/GPU cores, application-specific integrated circuit (ASIC) chips, field-programmable gate arrays (FPGAs), compressors or encoders, encryption functional blocks, compute units, embedded processors, accelerated processing units (APUs), controllers, requesters, completers, network communication links, and/or other functional blocks. When circuitry (e.g., integrated circuit elements, discrete circuit elements, etc.) in such hardware modules is activated, the circuitry performs some or all of the operations. In some embodiments, the hardware modules include general purpose circuitry such as execution pipelines, compute or processing units, etc. that, upon executing instructions (e.g., program code, firmware, etc.), performs the operations. In some embodiments, the hardware modules include purpose-specific or dedicated circuitry that performs the operations "in hardware" and without executing instructions.

In some embodiments, a data structure representative of some or all of the functional blocks and circuit elements described herein (e.g., electronic device 100 or some portion thereof) is stored on a non-transitory computer-readable storage medium that includes a database or other data structure which can be read by an electronic device and used, directly or indirectly, to fabricate hardware including the functional blocks and circuit elements. For example, the data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of transistors/circuit elements from a synthesis library that represent the functionality of the hardware including the above-described functional blocks and circuit elements. The netlist may then be placed and routed to produce a data set describing geometric shapes to be applied to masks. The masks may then be used in various semiconductor fabrication steps to produce a semiconductor circuit or circuits (e.g., integrated circuits) corresponding to the above-described functional blocks and circuit elements. Alternatively, the database on the computer accessible storage medium may be the netlist (with or without the synthesis library) or the data set, as desired, or Graphic Data System (GDS) II data.

In this description, variables or unspecified values (i.e., general descriptions of values without particular instances of the values) are represented by letters such as N, T, and X As used herein, despite possibly using similar letters in different locations in this description, the variables and unspecified values in each case are not necessarily the same, i.e., there may be different variable amounts and values intended for some or all of the general variables and unspecified values. In other words, particular instances of N and any other letters used to represent variables and unspecified values in this description are not necessarily related to one another.

The expression "et cetera" or "etc." as used herein is intended to present an and/or case, i.e., the equivalent of "at least one of" the elements in a list with which the etc. is associated. For example, in the statement "the electronic device performs a first operation, a second operation, etc.," the electronic device performs at least one of the first operation, the second operation, and other operations. In addition, the elements in a list associated with an etc. are merely examples from among a set of examples—and at least some of the examples may not appear in some embodiments.

The foregoing descriptions of embodiments have been presented only for purposes of illustration and description. They are not intended to be exhaustive or to limit the embodiments to the forms disclosed. Accordingly, many modifications and variations will be apparent to practitioners skilled in the art. Additionally, the above disclosure is not intended to limit the embodiments. The scope of the embodiments is defined by the appended claims.

What is claimed is:

1. A memory, comprising:
   two or more portions of memory circuitry; and
   two or more processor in memory (PIM) functional blocks comprising circuitry configured to perform in-memory computations, including at least a first PIM functional block associated with a first portion of the memory circuitry and a second PIM functional block associated with a second portion of the memory circuitry; and
   a shared buffer accessible by the first PIM functional block and the second PIM functional block; and
   wherein to make given data in the first portion of the memory circuitry available to the second PIM functional block:
   the first PIM functional block is configured to store the given data in the shared buffer; and
   the second PIM function block is configured to read the given data from the shared buffer.

2. The memory of claim 1, wherein the shared buffer is located on a base die of a plurality of memory dies of the memory circuitry.

3. The memory of claim 1, wherein, for writing the data in the shared buffer, the first PIM functional block:
   executes a PIM_SwizzledWrite instruction, causing the first PIM functional block to:
   write a block of data of a predetermined size from a source location for the first PIM functional block specified in the PIM_SwizzledWrite instruction into the shared buffer at an offset specified in the PIM- _SwizzledWrite instruction and as masked using masking information specified in the PIM_SwizzledWrite instruction.

4. The memory of claim 3, wherein, for reading the data from the shared buffer, the second PIM functional block:
executes a PIM_SwizzledRead instruction, causing the second PIM functional block to:
read a block of data of a predetermined size from the shared buffer and store the block of data in a destination location for the second PIM functional block specified in the PIM_SwizzledRead instruction at an offset in the shared buffer specified in the PIM_SwizzledRead instruction and as masked using masking information specified in the PIM_SwizzledRead instruction.

5. The memory of claim 4, wherein:
the source location accessible to the first PIM functional block is one of:
the first portion of the memory circuitry for the first PIM functional block, a PIM register file in the first PIM functional block, and a global input-output for the first PIM functional block; and
the destination location accessible to the second PIM functional block is one of:
the second portion of the memory circuitry for the second PIM functional block, and a PIM register file in the second PIM functional block.

6. The memory of claim 1, wherein, for writing the data in the shared buffer, the first PIM functional block:
executes a PIM_SSPWrite instruction, causing the first PIM functional block to:
write a block of data of a predetermined size from a data source for the first PIM functional block specified in the PIM_SSPWrite instruction into the shared buffer.

7. The memory of claim 1, wherein, for reading the data from the shared buffer, the second PIM functional block:
executes a PIM_SSPRead instruction, causing the second PIM functional block to:
read a block of data of a predetermined size from the shared buffer and store the block of data in a data destination for the second PIM functional block specified in the PIM_SSPRead instruction.

8. The memory of claim 1, wherein:
the memory includes two or more semiconductor integrated circuit dies with:
at least one memory die on which the two or more portions of memory circuitry and the two or more PIM functional blocks are located; and
an additional die accessible to all memory dies; and
the shared buffer is located on the additional die.

9. The memory of claim 1, further comprising:
masking circuitry configured to selectively block PIM functional blocks from performing specified operations based on masking information, wherein:
the masking circuitry permits the first PIM functional block and the second PIM functional block to perform the corresponding operations based on the masking information.

10. The memory of claim 9, wherein the memory further comprises:
a memory controller, wherein the masking information is set by one or more of the memory controller and one or more of the two or more PIM functional blocks.

11. The memory of claim 1, wherein each of the two or more PIM functional blocks has direct access to data in a respective portion of the memory circuitry, but does not have direct access to data in other portions of the memory circuitry.

12. The memory of claim 1, wherein the portions are banks, channels, or other logical or physical divisions of the memory circuitry.

13. A method for providing data to processor in memory (PIM) functional blocks in a memory that includes two or more portions of memory circuitry and two or more PIM functional blocks comprising circuitry configured to perform in-memory computations, including at least a first PIM functional block associated with a first portion of the memory circuitry and a second PIM functional block associated with a second portion of the memory circuitry, the method comprising:
accessing a shared buffer by the first PIM functional block and the second PIM functional block;
wherein to make data in the first portion of the memory circuitry available to the second PIM functional block:
storing, by the first PIM functional block, the data from the first portion of the memory circuitry in the shared buffer; and
reading, by the second PIM function block, the data from the shared buffer.

14. The method of claim 13, wherein the shared buffer is located on a base die of a plurality of memory dies of the memory circuitry.

15. The method of claim 14, wherein writing the data in the shared buffer includes:
executing, by the first PIM functional block, a PIM_SSPWrite instruction, which causes the first PIM functional block to:
write a block of data of a predetermined size from a data source for the first PIM functional block specified in the PIM_SSPWrite instruction into the shared buffer.

16. The method of claim 13, wherein writing the data in the shared buffer includes:
executing, by the first PIM functional block, a PIM_SwizzledWrite instruction, which causes the first PIM functional block to:
write a block of data of a predetermined size from a source location for the first PIM functional block specified in the PIM_SwizzledWrite instruction into the shared buffer at an offset specified in the PIM_SwizzledWrite instruction and as masked using masking information specified in the PIM_SwizzledWrite instruction.

17. The method of claim 16, wherein reading the data from the shared buffer includes:
executing, by the second PIM functional block, a PIM_SwizzledRead instruction, which causes the second PIM functional block to:
read a block of data of a predetermined size from the shared buffer and store the block of data in a destination location for the second PIM functional block specified in the PIM_SwizzledRead instruction at an offset in the shared buffer specified in the PIM_SwizzledRead instruction and as masked using masking information specified in the PIM_SwizzledRead instruction.

18. The method of claim 17, wherein:
the source location accessible to the first PIM functional block is one of:
the first portion of the memory circuitry for the first PIM functional block, a PIM register file in the first PIM functional block, and a global input-output for the first PIM functional block; and
the destination location accessible to the second PIM functional block is one of:
the second portion of the memory circuitry for the second PIM functional block, and a PIM register file in the second PIM functional block.

19. The method of claim 13, wherein reading the data from the shared buffer includes:
executing, by the second PIM functional block, a PIM_SSPRead instruction, which causes the second PIM functional block to:
read a block of data of a predetermined size from the shared buffer and store the block of data in a data destination for the second PIM functional block specified in the PIM_SSPRead instruction.

20. The method of claim 13, wherein:
the memory includes masking circuitry configured to selectively block PIM functional blocks from performing specified operations based on masking information; and
the method further comprises:
permitting, by the masking circuitry, the first PIM functional block and the second PIM functional block to perform the corresponding operations based on the masking information.

21. The method of claim 20, wherein:
the memory includes a memory controller; and
the method further comprises:
setting the masking information by one or more of the memory controller and one or more of the two or more PIM functional blocks.

22. The method of claim 13, wherein the portions are banks, channels, or other logical or physical divisions of the memory circuitry.

\* \* \* \* \*